United States Patent [19]
Kim et al.

[11] Patent Number: 5,441,904
[45] Date of Patent: Aug. 15, 1995

[54] METHOD FOR FORMING A TWO-LAYERED POLYSILICON GATE ELECTRODE IN A SEMICONDUCTOR DEVICE USING GRAIN BOUNDARIES

[75] Inventors: Jong C. Kim, Seoul; Sang H. Woo, Kyungki-Do, both of Rep. of Korea

[73] Assignee: Hyundai Electronics Industries, Co., Ltd., Kyungki-do, Rep. of Korea

[21] Appl. No.: 341,892

[22] Filed: Nov. 15, 1994

[30] Foreign Application Priority Data

Nov. 16, 1993 [KR] Rep. of Korea ............... 93-24301

[51] Int. Cl.$^6$ ............................... H01L 21/265
[52] U.S. Cl. ............................. 437/40; 437/189; 437/191; 437/193
[58] Field of Search ............... 437/40, 189, 191, 193

[56] References Cited

U.S. PATENT DOCUMENTS

| | | | |
|---|---|---|---|
| 4,354,309 | 10/1982 | Gardiner et al. | 29/571 |
| 4,816,425 | 3/1989 | McPherson | 437/200 |
| 4,829,024 | 5/1989 | Klein et al. | 437/189 |
| 4,868,140 | 9/1989 | Yonehara | 437/247 |
| 5,093,700 | 3/1992 | Sakata | 357/23.1 |
| 5,212,105 | 5/1993 | Kizu et al. | 437/44 |
| 5,350,698 | 9/1994 | Huang et al. | 437/26 |

FOREIGN PATENT DOCUMENTS 63-44770 2/1988 Japan .

Primary Examiner—Brian E. Hearn
Assistant Examiner—Lynne A. Gurley
Attorney, Agent, or Firm—Pennie & Edmonds

[57] ABSTRACT

A method is disclosed for forming a gate electrode having two polysilicon layers and a tungsten silicide layer to prevent fluorine gas diffusion along grain boundaries from penetrating into a gate oxide film.

This method for forming a gate electrode is comprised of sequentially forming a gate oxide film and a first polysilicon layer on a silicon substrate, enlarging the grain size of the first polysilicon layer by heat treatment, introducing a reagent gas, either $SiH_4$ or $Si_2H_6$, to further adjust the grain size within said layer, forming a second polysilicon layer on the first polysilicon layer, enlarging the grain size of the second polysilicon layer by heat treatment, introducing a reagent gas, either $Si_2H_6$ or $SiH_4$, whichever one was not used to treat the first polysilicon layer, forming a tungsten silicide layer on the second polysilicon layer, and patterning the tungsten silicide layer, the second polysilicon layer and the first polysilicon layer by means of a mask etching process.

11 Claims, 1 Drawing Sheet

METHOD FOR FORMING A TWO-LAYERED POLYSILICON GATE ELECTRODE IN A SEMICONDUCTOR DEVICE USING GRAIN BOUNDARIES

BACKGROUND OF THE INVENTION

FIELD OF THE INVENTION

The present invention relates to method for forming a gate electrode of a semiconductor device, and more particularly to a method for forming a gate electrode having two polysilicon layers, in which the grain size of one layer differs from that of the other layer, and a tungsten silicide layer, to prevent diffusion of fluorine gas through grain boundaries within the polysilicon layers and subsequent penetration of such gas into a gate oxide film during the formation of the tungsten silicide layer.

INFORMATION DISCLOSURE STATEMENT

Under the prior art, polycide structures having a single polysilicon layer and a tungsten silicide layer are widely used for making transistor gate electrodes in a semiconductor device.

A method for forming a gate electrode having a polycide structure is as follows.

After a gate oxide film has been formed on a silicon substrate, a polysilicon layer is formed on the gate oxide film by means of low pressure chemical vapor deposition(LPCVD) at a temperature of about 600 degrees Celsius.

A tungsten silicide layer is then formed on the polysilicon layer by means of chemical vapor deposition(CVD) using $WF_6$ gas. As heat treatment is applied the gate electrode is formed by means of a word line mask process.

During such heat treatment process, fluorine(F) from the $WF_6$ gas used for forming the tungsten silicide layer rapidly diffuses along the grain boundaries of the polysilicon layer and ultimately penetrates into the gate oxide film. As a result, the thickness of the gate oxide film increases, thereby lowering the electrical characteristics of the gate oxide film.

SUMMARY OF THE INVENTION

An object of the present invention is to provide an improved method for forming a gate electrode of a semiconductor device particularly with respect to improving the electrical characteristics of such device.

Another object of the present invention is to provide a means to prevent diffusion of fluorine along the grain boundaries within the polysilicon layers, and its resultant penetration into the gate oxide film, during formation of the tungsten silicide layer.

Another object of the present invention is to provide a method for improving the electrical characteristics of a transistor in a semiconductor device.

According to the present invention, a gate oxide film and a first polysilicon layer are sequentially formed on a silicon substrate. The first polysilicon layer is annealed to enlarge the size of grains. A second polysilicon layer is formed over the first polysilicon layer. The second polysilicon layer annealed to enlarge the size of grains. A tungsten silicide layer is formed upon the second polysilicon layer. The first and second polysilicon layers and the tungsten silicide layer are then partially etched by means of a mask process and an etching process, thereby forming a gate electrode. An important feature of this method is to make the size of the grains within the first polysilicon layer different from the size of the grains of the second polysilicon layer. The size of the grains of the first polysilicon layer can be made to be either larger or smaller than the size of the grains of the second polysilicon layer. If the desired effect is to make the second layer grains larger than the first layer grains, the first polysilicon layer is formed using $SiH_4$ gas and $PH_3$ gas, and the second polysilicon layer is formed using $Si_2H_6$ gas and $PH_3$ gas. If the desired effect is to make the first layer larger than the second layer grains the first polysilicon layer is formed using $Si_2H_6$ gas and $PH_3$ gas, and the second polysilicon layer is formed using $SiH_4$ gas and $PH_3$ gas. The first polysilicon layer and the second polysilicon layer are formed at temperatures ranging from 500 to 530 degrees Celsius. The heat treatment for forming the first and second polysilicon layers are applied using an inert gas at temperatures ranging from 600 to 650 degrees Celsius for four to ten hours. The inert gas used can be either is Argon(Ar) or Nitride($N_2$) gas. No grain boundary within the first polysilicon layer aligns vertically with any grain boundary within the second polysilicon layer at the interface between the first and second polysilicon layers.

BRIEF DESCRIPTION OF THE DRAWINGS

A more complete understanding of the present invention can be obtained by considering the following detailed description taken in conjunction with the accompanying drawings in which.

Similar reference characters refer to similar parts throughout the several drawings.

DETAILED DESCRIPTION OF THE INVENTION

FIGS. 1A through 1D are cross-sectional views of the subject invention showing the steps in the formation of a gate electrode in accordance with an embodiment of the present invention.

Figure 1A:
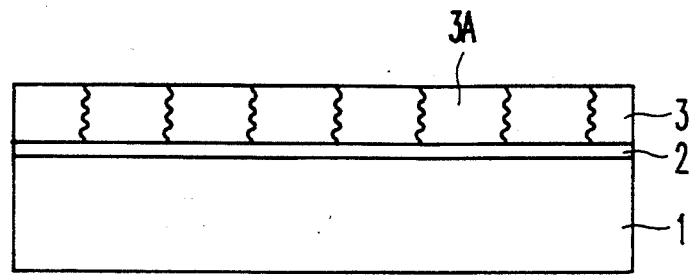
FIGS. 1A–1D are cross-sectional views of the subject invention illustrating various steps in the formation of a gate electrode in accordance with the present invention.

Referring to FIG. 1A, a gate oxide film 2 and the first polysilicon layer 3 are sequentially formed on a silicon substrate 1, and heat treatment is applied to enlarge the grain size of the first polysilicon layer 3.

The first polysilicon layer 3 is formed on the gate oxide layer 2 in a chamber by means of the application of either $SiH_4$ and $PH_3$ or $Si_2H_6$ and $PH_3$ gas, depending on whether smaller or larger grain sizes are desired, respectively, at temperatures ranging from 500 to 530 degrees Celsius. In order to enlarge size of the grains 3A of the first polysilicon layer 3, heat treatment is applied in the chamber and an inert gas, such as Argon(Ar) or Nitride($N_2$) gas is introduced at a temperature ranging from 600 to 650 degrees Celsius for a period of four to ten hours.

Figure 1B:
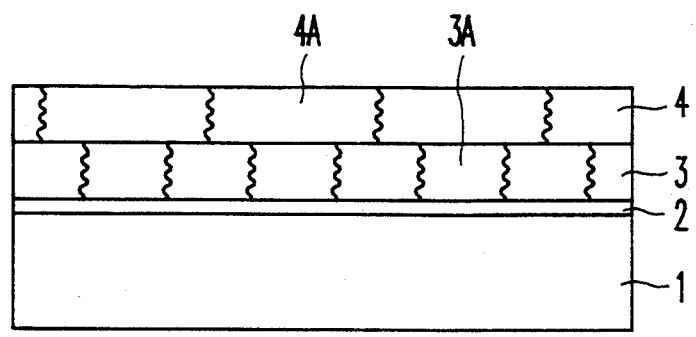

Referring to Fig. 1B, a second polysilicon layer 4 is formed over the first polysilicon layer 3, and heat treatment is applied to enlarge the grain size of the second polysilicon layer 4.

The second polysilicon layer 4 is formed in the chamber by means of the introduction into the chamber of either $Si_2H_6$ and $PH_3$ or $SiH_4$ and $PH_3$ gas, depending on whether smaller or larger grain sizes are desired, respectively, at temperatures ranging from 500 to 530 degrees Celsius. In order to enlarge size of the grains 4A in the second polysilicon layer 4, heat treatment is applied in the chamber with an inert gas, such as Argon(Ar) or Nitride($N_2$), at temperatures ranging from 600 to 650 degrees Celsius for a period of four to ten hours.

An important factor to note with respect to FIGS. 1A and 1B is the kind of reagent gases used during formation of each the polysilicon layers. When the first and the second polysilicon layers 3 and 4 respectively, are formed, the size of grains within each layer 3A and 4A respectively varies according to which of the reagent gases, $SiH_4$ or $Si_2H_6$ is used.

The grains 4A of the polysilicon layer 4 formed by $Si_2H_6$ gas as the reagent gas are two to four times larger as the grains 3A of the polysilicon layer 3 formed by $SiH_4$ as the reagent gas.

Therefore, no grain boundary 3B within the first polysilicon layer 3 aligns vertically with any grain boundary 4B within the second polysilicon layer 4 at the interface between the first and second polysilicon layers 3, 4.

Alternatively, as another embodiment of the present invention, the first polysilicon layer 3 could also be formed by using $Si_2H_6$ gas and the second polysilicon layer 4 could be formed by using $SiH_4$ gas resulting in the grains 3A of the first polysilicon layer 3 being larger than the grains 4A of the second polysilicon layer 4. No grain boundary 3B within the first polysilicon layer 3 is vertically aligned with any grain boundary 4B within the second polysilicon layer 4 at the interface between the first and second polysilicon layers 3, 4.

Figure 1C:
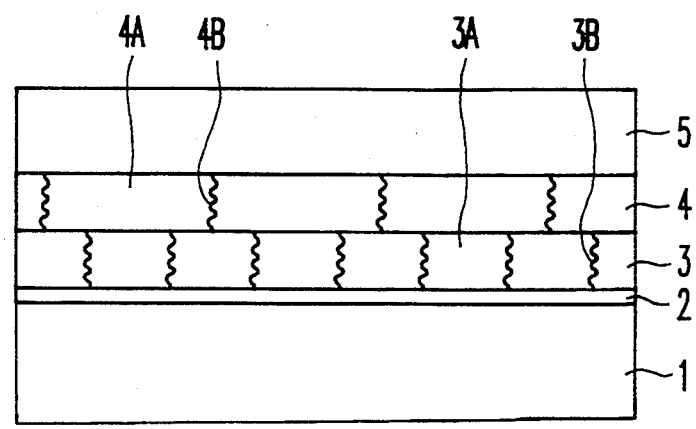

Referring to FIG. 1C, a tungsten silicide layer 5 is formed upon the second polysilicon layer 4 using $WF_6$ gas. Then heat treatment at high temperature is applied to the tungsten silicide layer 5.

During the heat treatment, generally, fluorine from the $WF_6$ gas diffuses along the grain boundaries of the first and second polysilicon layers. However, because of the difference in sizes of the grains of the first and second polysilicon layers, and the relative alignment thereof, no grain boundary 3B of the first polysilicon layer 3 aligns vertically with any grain boundary 4B of the second polysilicon layer 4 at the interface between the first and second polysilicon layers 3 and 4, and consequently, the fluorine can not diffuse or penetrate into the gate oxide film 2.

Figure 1D:
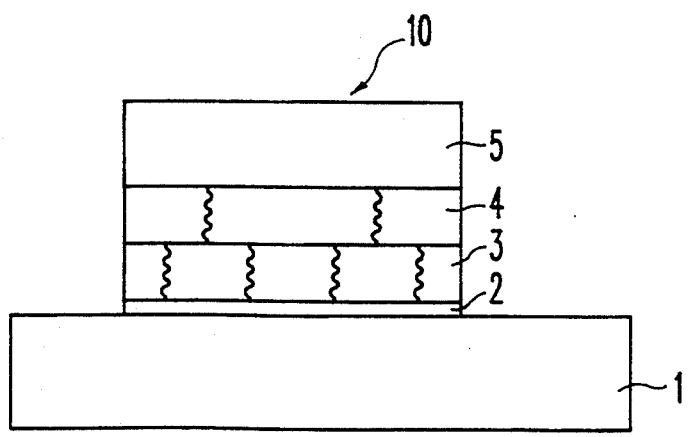

Referring to FIG. 1D, the first and second polysilicon layers 3, 4 and the tungsten silicide layer 5 are partially etched by means of word line mask process and an etching process, thereby forming a gate electrode 10.

The present invention prevents diffusion of fluorine gas through grain boundaries between polysilicon layers and subsequent penetration of such gas into a gate oxide film during the formation of the tungsten silicide. Prevention of such diffusion and penetration is made possible by the presence of two polysilicon layers with one layer having different sized grains from that of the other layer and can improve a transistor's electrical characteristic in a semiconductor device.

Although this invention has been described in its preferred form with a certain degree of particularity, it is appreciated by those skilled in the art that the present disclosure of the preferred form has been made only as an example and that numerous changes in the details of the construction, combination and arrangement of its parts may be resorted to without departing from the spirit and scope of the invention.

What is claimed is:

1. A method for forming a gate electrode of a semiconductor device comprised of:

sequentially forming a gate oxide film and a first polysilicon layer, respectively, over a silicon substrate;

annealing said first polysilicon layer to enlarge the size of the grains thereof;

forming a second polysilicon layer over said annealed first polysilicon layer;

annealing said second polysilicon layer to enlarge the size of the grains thereof;

forming a tungsten silicide layer over said annealed second polysilicon layer; and etching said tungsten silicide layer, said second polysilicon layer and said first polysilicon layer by means of a mask process and an etching process, thereby forming a gate electrode.

2. The method of claim 1, wherein the size of the grains of said first polysilicon layer is made to be different from that of the said second polysilicon layer.

3. The method of claim 2, wherein the size of the grains of said first polysilicon layer is made to be larger than that of said second polysilicon layer.

4. The method of claim 2, wherein the size of the grains of said first polysilicon layer is made to be smaller than that of said second polysilicon layer.

5. The method of claim 1, wherein said first polysilicon layer is formed using $SiH_4$ gas and $PH_3$ gas, and said second polysilicon layer is formed using $Si_2H_6$ gas and $PH_3$ gas.

6. The method of claim 1, wherein said first polysilicon layer is formed using $Si_2H_6$ gas and $PH_3$ gas, said second polysilicon layer is formed using $SiH_4$ gas and $PH_3$ gas.

7. The method of claim 1, wherein said first and second polysilicon layers are formed at a temperature ranging from 500 to 530 degrees Celsius.

8. The method of claim 1, wherein said first and second polysilicon layers are formed by a heat treatment cycle using an inert gas at a temperature ranging from 600 to 650 degrees Celsius for four to ten hours.

9. The method of claim 8, wherein said inert gas is Argon(Ar) gas.

10. The method of claim 8, wherein said inert gas is Nitride($N_2$) gas.

11. The method of claim 1, wherein no grain boundary within said first polysilicon layer aligns vertically with any grain boundary within said second polysilicon layer at the interface between said first and second polysilicon layers.

* * * * *